United States Patent
Parkhe et al.

(10) Patent No.: US 10,056,284 B2
(45) Date of Patent: Aug. 21, 2018

(54) ELECTROSTATIC CHUCK OPTIMIZED FOR REFURBISHMENT

(71) Applicant: Applied Materials, Inc., Santa Clara, CA (US)

(72) Inventors: Vijay D. Parkhe, San Jose, CA (US); Kadthala Ramaya Narendrnath, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/595,877

(22) Filed: May 15, 2017

(65) Prior Publication Data

US 2017/0250101 A1    Aug. 31, 2017

Related U.S. Application Data

(62) Division of application No. 14/209,967, filed on Mar. 13, 2014, now Pat. No. 9,669,653.
(Continued)

(51) Int. Cl.
  *C03C 25/68* (2006.01)
  *H01L 21/683* (2006.01)
  (Continued)

(52) U.S. Cl.
  CPC ........ *H01L 21/6833* (2013.01); *B24B 37/042* (2013.01); *B24B 37/26* (2013.01);
  (Continued)

(58) Field of Classification Search
  CPC .............. B24B 1/00; B81C 2201/0104; H01L 21/30625; H01L 21/3212
  (Continued)

(56) References Cited

U.S. PATENT DOCUMENTS

| 4,439,248 A | 3/1984 | Herchenroeder et al. |
| 5,381,944 A | 1/1995 | Makowiecki et al. |

(Continued)

FOREIGN PATENT DOCUMENTS

| DE | 10224137 A1 | 12/2003 |
| JP | H06216224 | 8/1994 |

(Continued)

OTHER PUBLICATIONS

Taffner et al., "Preparation and Microstructural Analysis of High-Performance Ceramics," ASM Handbook vol. 9: Vletallography and Microstructures, copyright 2004, 11 pages, ASM International, Materials Park, Ohio, USA.

(Continued)

*Primary Examiner* — Binh X Tran
(74) *Attorney, Agent, or Firm* — Lowenstein Sandler LLP

(57) ABSTRACT

A method of manufacturing an electrostatic chuck includes bonding an electrostatic puck to a metal base plate, wherein the electrostatic puck has an electrode embedded in the electrostatic puck. The method further includes subsequently polishing a surface of the electrostatic puck to a flatness of below 10 microns and an average surface roughness of approximately 2-6 micro-inches. The method further includes subsequently forming surface features on a surface of the electrostatic puck, the surface features comprising mesas and a sealing band around a perimeter of the electrostatic puck.

20 Claims, 9 Drawing Sheets

Related U.S. Application Data

(60) Provisional application No. 61/785,253, filed on Mar. 14, 2013.

(51) Int. Cl.
  *B24C 1/06* (2006.01)
  *B24C 1/04* (2006.01)
  *B24B 37/26* (2012.01)
  *B24B 37/04* (2012.01)
  *H01L 21/321* (2006.01)
  *H01L 21/306* (2006.01)

(52) U.S. Cl.
  CPC ............... *B24C 1/04* (2013.01); *B24C 1/06* (2013.01); *H01L 21/30625* (2013.01); *H01L 21/3212* (2013.01)

(58) Field of Classification Search
  USPC .............. 216/88, 89, 95; 438/691; 428/691
  See application file for complete search history.

(56) References Cited

U.S. PATENT DOCUMENTS

| | | |
|---|---|---|
| 5,548,470 A | 8/1996 | Husain et al. |
| 5,631,803 A | 5/1997 | Cameron et al. |
| 5,800,871 A | 9/1998 | Collins et al. |
| 5,916,689 A | 6/1999 | Collins et al. |
| 6,063,203 A | 5/2000 | Satoh |
| 6,194,083 B1 | 2/2001 | Yasuda et al. |
| 6,245,202 B1 | 6/2001 | Edamura et al. |
| 6,361,645 B1 | 3/2002 | Schoepp et al. |
| 6,506,254 B1 | 1/2003 | Bosch et al. |
| 6,534,194 B2 | 3/2003 | Weihs et al. |
| 6,581,275 B2 | 6/2003 | Narendrnath et al. |
| 6,616,031 B2 | 9/2003 | Wong et al. |
| 6,805,952 B2 | 10/2004 | Chang et al. |
| 6,933,254 B2 | 8/2005 | Morita et al. |
| 6,942,929 B2 | 9/2005 | Han et al. |
| 7,441,688 B2 | 10/2008 | Van Heerden et al. |
| 7,615,133 B2 | 11/2009 | Tateno et al. |
| 7,649,729 B2 | 1/2010 | Buchberger, Jr. et al. |
| 7,690,308 B2 | 4/2010 | Nielson et al. |
| 7,696,117 B2 | 4/2010 | Sun et al. |
| 7,718,007 B2 | 5/2010 | Oohashi et al. |
| 7,810,704 B2 | 10/2010 | Duckham et al. |
| 7,964,517 B2 | 6/2011 | Jaiswal |
| 8,034,734 B2 | 10/2011 | Sun et al. |
| 8,075,729 B2 | 12/2011 | Holland et al. |
| 8,206,829 B2 | 6/2012 | Sun et al. |
| 8,404,572 B2 | 3/2013 | Chang et al. |
| 2003/0007308 A1 | 1/2003 | Harada et al. |
| 2003/0047802 A1 | 3/2003 | Hiramatsu et al. |
| 2004/0055709 A1* | 3/2004 | Boyd, Jr. ............... B23Q 3/154 156/345.51 |
| 2004/0187787 A1 | 9/2004 | Dawson et al. |
| 2005/0266682 A1 | 12/2005 | Chen et al. |
| 2006/0164785 A1 | 7/2006 | Pellegrin |
| 2007/0047170 A1* | 3/2007 | Sun ..................... H01L 21/6833 361/234 |
| 2007/0212567 A1 | 9/2007 | Esaki et al. |
| 2008/0016684 A1 | 1/2008 | Olechnowicz et al. |
| 2008/0029032 A1 | 2/2008 | Sun et al. |
| 2008/0174930 A1 | 7/2008 | Hattori et al. |
| 2008/0264564 A1 | 10/2008 | Sun et al. |
| 2008/0264565 A1 | 10/2008 | Sun et al. |
| 2008/0268645 A1 | 10/2008 | Kao et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0036292 A1 | 2/2009 | Sun et al. |
| 2009/0214825 A1 | 8/2009 | Sun et al. |
| 2009/0284894 A1 | 11/2009 | Cooke |
| 2010/0053841 A1 | 3/2010 | Rusinko, Jr. et al. |
| 2010/0116788 A1 | 5/2010 | Singh et al. |
| 2010/0118464 A1* | 5/2010 | Matsuyama ........ H01L 21/6833 361/234 |
| 2010/0119843 A1 | 5/2010 | Sun et al. |
| 2010/0177454 A1 | 7/2010 | Elliot et al. |
| 2010/0314356 A1 | 12/2010 | Nagayama et al. |
| 2011/0049729 A1 | 3/2011 | Naundorf et al. |
| 2011/0149462 A1 | 6/2011 | Kugimoto et al. |
| 2011/0174441 A1 | 7/2011 | Yamashita et al. |
| 2012/0034469 A1 | 2/2012 | Sun et al. |
| 2012/0076574 A1 | 3/2012 | Parkhe |
| 2012/0104703 A1 | 5/2012 | Sun et al. |
| 2012/0141661 A1 | 6/2012 | Cho et al. |
| 2012/0299253 A1 | 11/2012 | Kosakai et al. |
| 2012/0307412 A1 | 12/2012 | Boyd, Jr. et al. |
| 2013/0011773 A1* | 1/2013 | Nakanishi ................. G03F 1/24 430/5 |
| 2013/0019797 A1 | 1/2013 | Tanaka et al. |
| 2013/0026720 A1 | 1/2013 | Hori et al. |
| 2013/0093146 A1* | 4/2013 | Aihara ................ C04B 35/6269 279/128 |
| 2013/0120896 A1* | 5/2013 | Ono ..................... H01L 21/6833 361/233 |
| 2013/0120897 A1* | 5/2013 | Lin ........................ H02N 13/00 361/234 |
| 2013/0224675 A1 | 8/2013 | Park |

FOREIGN PATENT DOCUMENTS

| | | |
|---|---|---|
| JP | 2000-306986 | 11/2000 |
| JP | 2001-308075 | 11/2001 |
| JP | 2008-016709 | 1/2008 |
| WO | WO2001024581 | 4/2001 |
| WO | WO2003100843 | 12/2003 |
| WO | WO2005027203 | 3/2005 |

OTHER PUBLICATIONS

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.
Haas et al., "Gas jet assisted vapor deposition of Atria stabilized zirconia," Department of Materials Science and Engineering, School of Engineering and Applied Science, published Feb. 27, 2009 University of Virginia, Charlottesville, Virginia 22903.
Di Girolamo et al., "Microstructure and thermal properties of plasma-sprayed ceramic thermal barrier coatings," Energia, Ambiente e Innovazione, Published Jan. 2, 2013.
Bergant et al., "Porosity evaluation of flame-sprayed and heat-treated coatings using image analysis," Image Anal Stereol 2011;30:53-62, Published Jan. 27, 2011.
"Logical conjunction", Wikipedia, the Free Encyclopedia; last modified Jul. 20, 2016, 6 pages, downloaded from https://en.wikipedia.org/wiki/Logical_conjunction on Oct. 27, 2016.
"Venn Diagrams", Vose software, copyright 2007, 4 pages; downloaded from http://www.vosesoftware.com/ModelRiskHelp/index.htm#Probability_theory_and_statistics/The_basics/Probability_rules_and_diagrams/Venn_diagrams.html on Oct. 27, 2016.

* cited by examiner

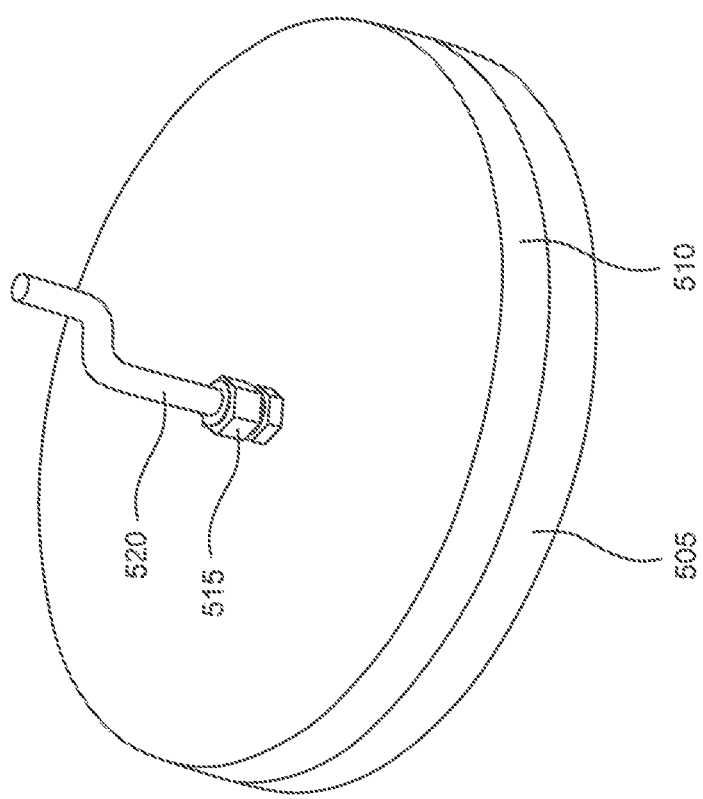

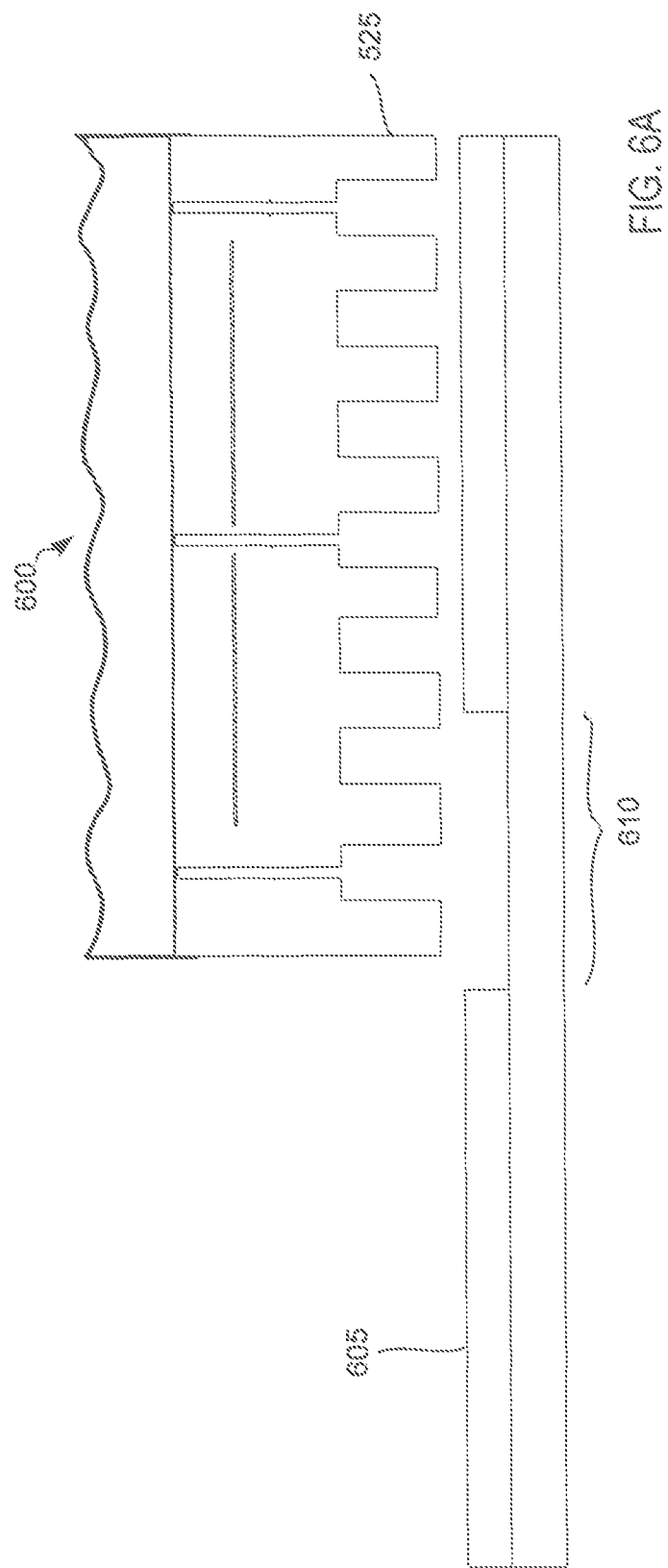

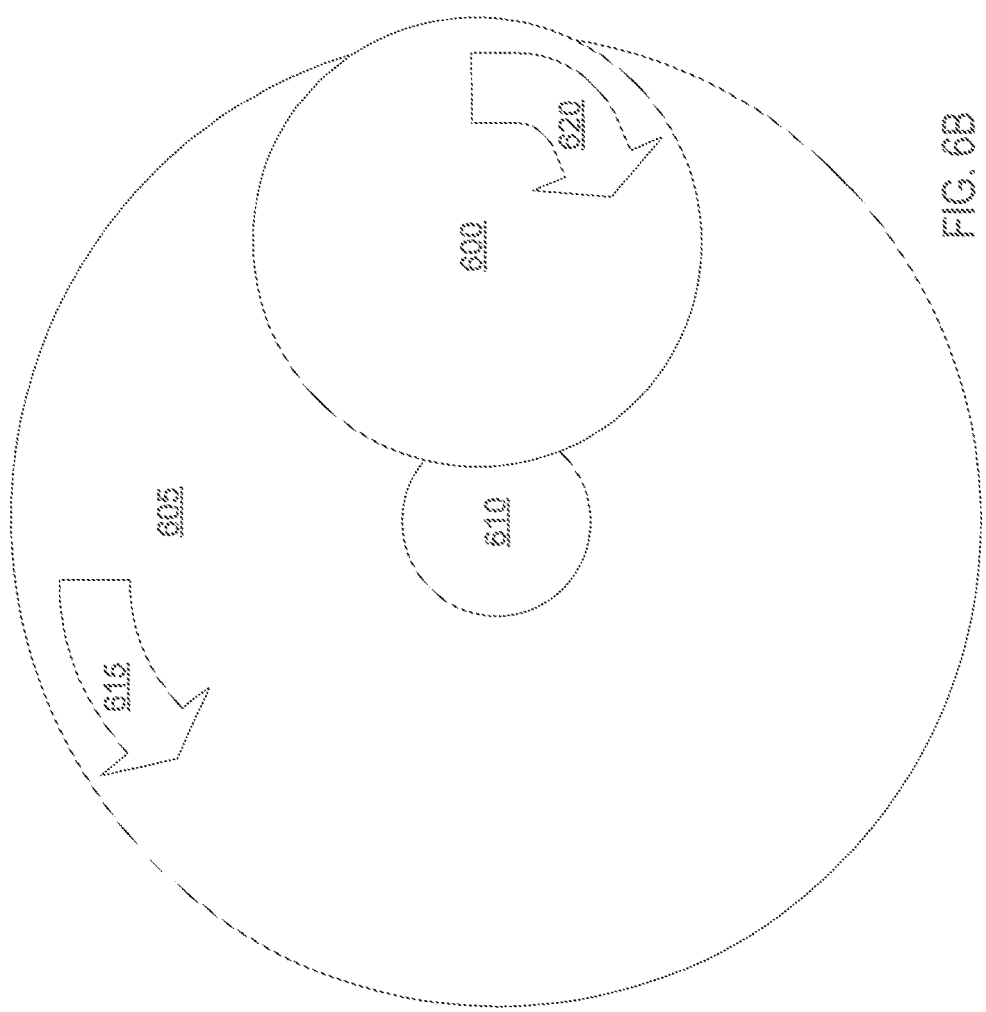

US 10,056,284 B2

ELECTROSTATIC CHUCK OPTIMIZED FOR REFURBISHMENT

RELATED APPLICATIONS

This application is a divisional application of U.S. patent application Ser. No. 14/209,967, filed Mar. 13, 2014, now issued as U.S. Pat. No. 9,669,653 issued on Jun. 6, 2017, which claims priority to U.S. Provisional Patent Application 61/785,253, filed Mar. 14, 2013, both of which are herein incorporated by reference.

TECHNICAL FIELD

Embodiments of the present invention relate, in general, to a refurbished electrostatic chuck and methods for refurbishing an electrostatic chuck.

BACKGROUND

Electrostatic chucks are used to support substrates during processing. One function of an electrostatic chuck is to regulate a temperature of the supported substrate. To facilitate such temperature regulation, a surface of the electrostatic chuck that supports the substrate includes multiple surface features including mesas and a sealing band around a perimeter of the surface. During processing, a heat conductive fluid such as helium gas is pumped into an interface between the electrostatic chuck and the supported substrate. The sealing band seals the interface between the electrostatic chuck and the suspended substrate, preventing the heat conductive fluid from escaping. Over time, processing erodes the surface features such as the sealing band, increasing their roughness and introducing leakage pathways. This introduces or increases a leakage rate of the fluid. Typically, electrostatic chucks are discarded once they reach a particular leakage rate.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 5 illustrates one embodiment of a back plate fixture for use during polishing of an electrostatic chuck.

FIG. 6A illustrates a cross sectional side view of an electrostatic chuck undergoing polishing.

FIG. 6B illustrates a top down view of an electrostatic chuck undergoing polishing.

DETAILED DESCRIPTION OF EMBODIMENTS

Figure 1:
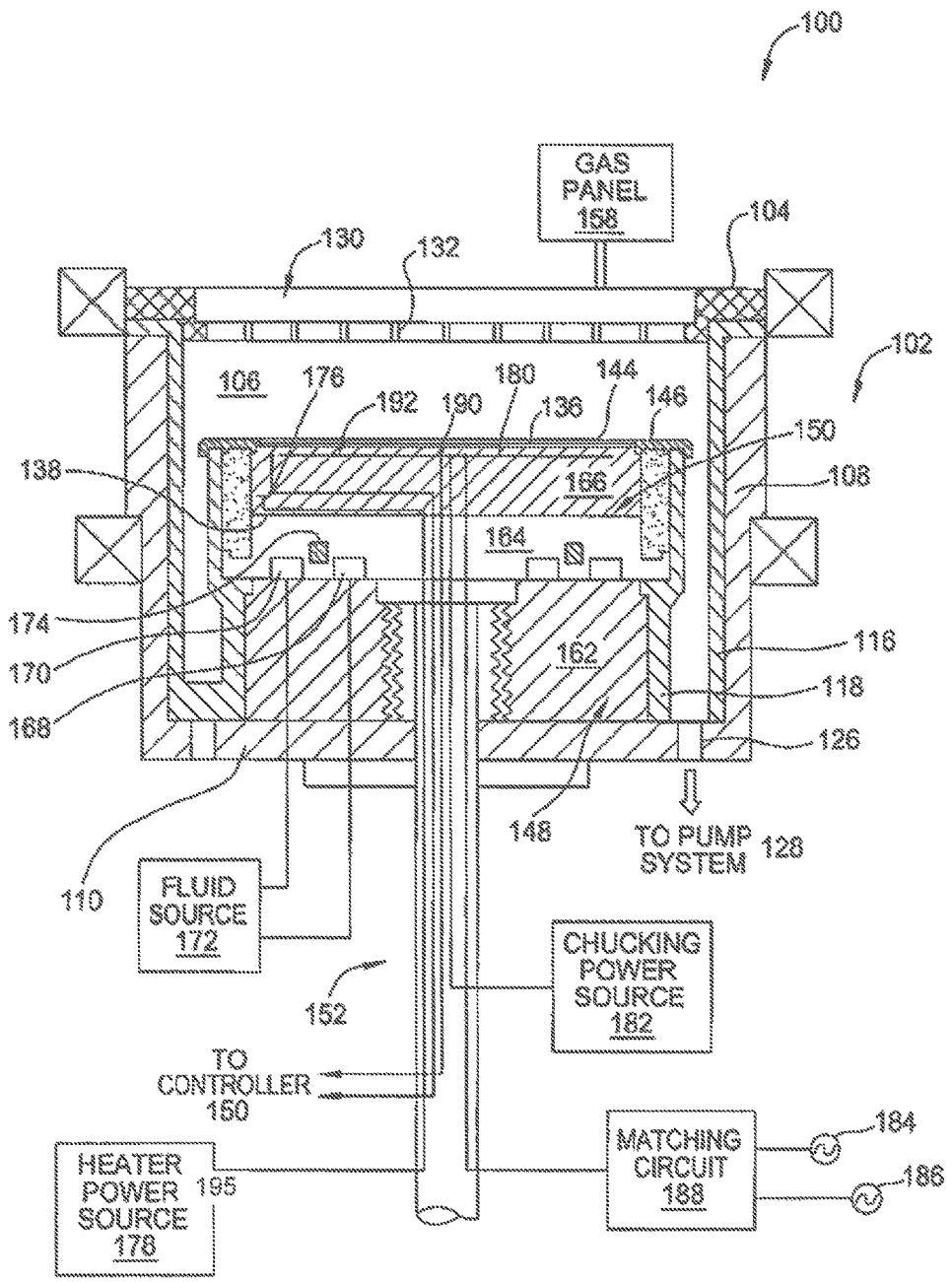
FIG. 1 depicts a sectional view of one embodiment of a processing chamber including a refurbished electrostatic chuck.

Described herein are embodiments of an electrostatic chuck that is manufactured to have a flat and smooth surface optimized for future refurbishment. Also described are a refurbished electrostatic chuck and a method for refurbishing an electrostatic chuck. In one embodiment, an indication is received that an electrostatic chuck has a wafer backside leakage rate that exceeds a leakage threshold. The indication may be based on a measured gas leakage rate between a chucked wafer and the surface of the electrostatic chuck. A refurbisher determines whether a first polishing procedure that polishes surface features on a surface of the electrostatic chuck without removing the surface features would reduce a thickness of the surface features to below a thickness threshold. If the first polishing procedure would not reduce the thickness of the surface features to below the thickness threshold, then the refurbisher polishes the electrostatic chuck using the first polishing procedure. If the first polishing procedure would reduce the thickness of the surface features to below the thickness threshold, then the refurbisher performs a second polishing procedure that removes the surface features from the surface of the electrostatic chuck. The refurbisher then forms new surface features on the surface of the electrostatic chuck.

An electrostatic chuck can be a costly chamber component for processing chambers. Embodiments for refurbishing electrostatic chucks described herein can prolong the lifespan of electrostatic chucks from about 100-200 radio frequency hours (RFHrs) to up to about 4000 RFHrs. Accordingly, embodiments for refurbishing electrostatic chucks described herein can prolong the lifespan of the electrostatic chucks up to 5-20 times the life spans of traditional electrostatic chucks, thus providing cost savings for consumers of the electrostatic chucks.

In an example, an electrostatic chuck may be manufactured with surface features having a thickness of 16 microns, and may have a minimum thickness of 8 microns. Additionally, an electrostatic puck of the electrostatic chuck may be manufactured with a thickness of 300 microns and have a minimum thickness of 200 microns. An example first polishing procedure (soft polish) may remove 2 microns of material from the surface features, and an example second polishing procedure (hard polish) may remove 15 microns of material from the electrostatic puck, and then new 16 micron thick surface features may be created. The electrostatic chuck may be refurbished 4 times using the soft polish, then refurbished once using the hard polish, then refurbished 4 more times using the soft polish, then refurbished again using the hard polish, then refurbished 4 more times using the hard polish, then refurbished again using the hard polish, then refurbished 4 last times using the soft polish. Accordingly, the example electrostatic chuck may be refurbished a total of 19 times, significantly extending the life of the electrostatic chuck.

FIG. 1 is a sectional view of one embodiment of a semiconductor processing chamber 100 having a substrate support assembly 148 disposed therein. The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, the gas distribution assembly 130 can have a center hole where gases are fed through a ceramic gas nozzle. The gas distribution assembly 130 may be fabricated and/or coated by a ceramic material, such as silicon carbide, yttria, etc. to provide resistance to halogen-containing chemistries to prevent the gas distribution assembly 130 from corrosion.

The substrate support assembly 148 is disposed in the interior volume 106 of the processing chamber 100 below the gas distribution assembly 130. The substrate support assembly 148 holds the substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. The electrostatic chuck 150 further includes a thermally conductive base 164 bonded to a ceramic body (referred to as an electrostatic puck 166) via a bond 138. The electrostatic puck 166 may be fabricated by a ceramic material such as aluminum nitride (AlN) or aluminum oxide ($Al_2O_3$). The electrostatic puck 166 may also be fabricated from rare earth ceramic materials and rare earth oxides, such as yttria. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/ or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, that may be formed in an upper surface of the puck 166. The gas passages may be fluidly coupled to a source of a thermally conductive gas, such as He via holes drilled in the puck 166. In operation, the gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

The electrostatic chuck 150 may be a refurbished electrostatic chuck that has been refurbished in accordance with embodiments of the present invention. The electrostatic chuck 150 may additionally be removed from the semiconductor processing chamber 100 and further refurbished. In accordance with embodiments described herein, the electrostatic chuck may be refurbished anywhere from 2 to 10 times or more during a life of the electrostatic chuck. The more times that the electrostatic chuck can be refurbished, the greater the cost savings for using the electrostatic chuck 150.

Figure 2:
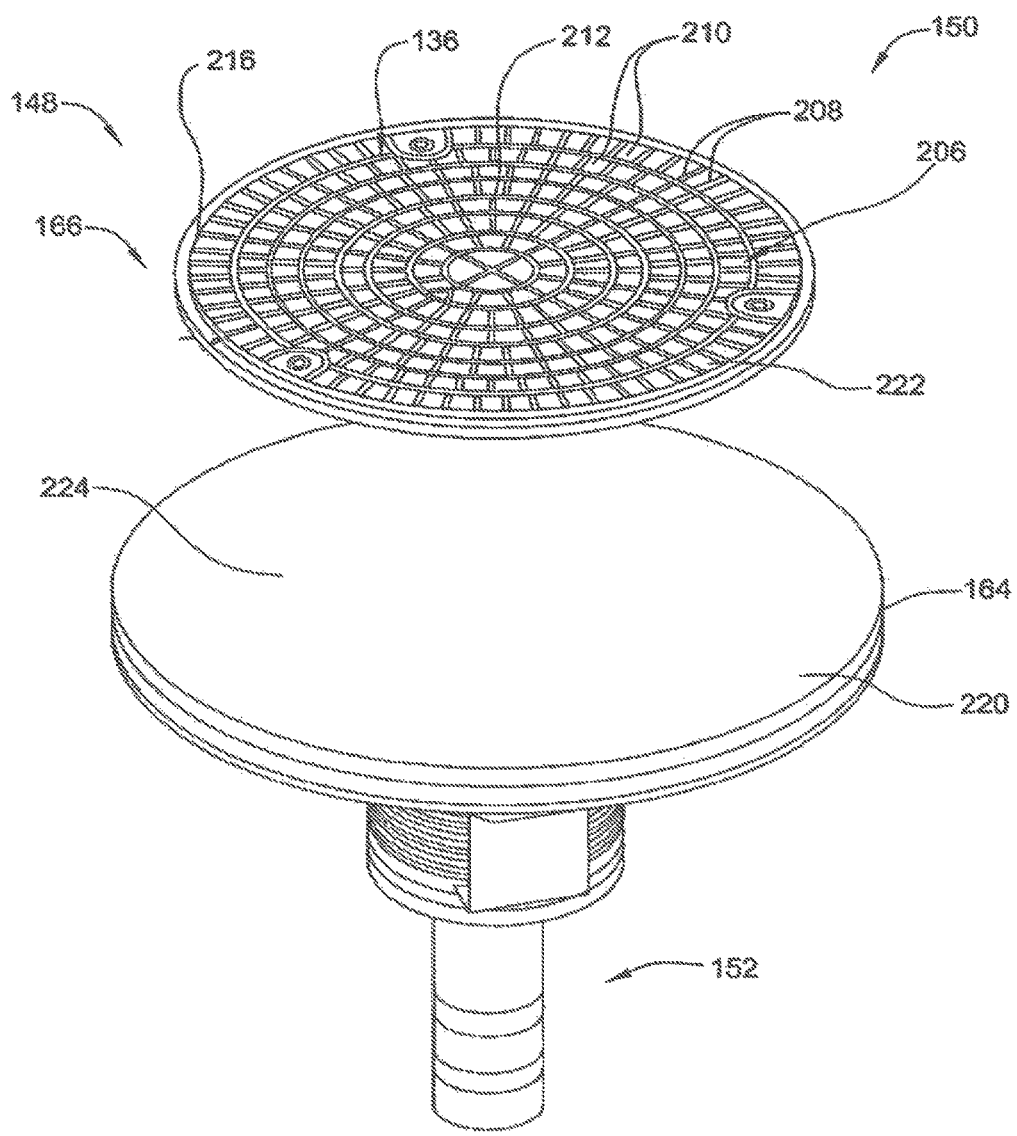
FIG. 2 depicts an exploded view of one embodiment of a refurbished electrostatic chuck.

FIG. 2 depicts an exploded view of one embodiment of the substrate support assembly 148. The substrate support assembly 148 depicts an exploded view of the electrostatic chuck 150 and the pedestal 152. The electrostatic chuck 150 may be a new or refurbished electrostatic chuck, in accordance with embodiments described herein. The electrostatic chuck 150 includes the electrostatic puck 166 and the thermally conductive base 164 attached to the electrostatic puck 166. The electrostatic puck 166 may be bonded to the thermally conductive base 164 by a silicone bond, or by another bonding material. For example, the bond may include a thermal conductive paste or tape having at least one of an acrylic based compound and silicone based compound. Example bonding materials include a thermal conductive paste or tape having at least one of an acrylic based compound and silicone based compound with metal or ceramic fillers mixed or added thereto. The metal filler may be at least one of Al, Mg, Ta, Ti, or combination thereof and the ceramic filler may be at least one of aluminum oxide ($Al_2O_3$), aluminum nitride (AlN), titanium diboride ($TiB_2$) or combination thereof.

The electrostatic puck 166 has a disc-like shape having an annular periphery 222 that may substantially match the shape and size of the substrate 144 positioned thereon. An upper surface 206 of the electrostatic puck 166 may have numerous surface features 136. The surface features 136 may include an outer sealing band 216, multiple mesas 210, and channels 208, 212 between the mesas 210. The thermally conductive base 164 attached below the electrostatic puck 166 may have a disc-like main portion 224 and an annular flange 220 extending outwardly from a main portion 224 and positioned on the pedestal 152.

In one embodiment, the thermally conductive base 164 is fabricated by a metal, such as aluminum or stainless steel or other suitable materials. Alternatively, the thermally conductive base 164 may be fabricated by a composite of ceramic and metal material providing good strength and durability as well as heat transfer properties. The composite material may have a thermal expansion coefficient that is substantially matched to the overlying puck 166 to reduce thermal expansion mismatch.

In traditional electrostatic chucks, a surface of the electrostatic puck 166 is polished and surface features (e.g., mesas 210 and sealing band 216 are formed in the surface prior to bonding the electrostatic puck 166 to the thermally conductive base 164. However, the process of bonding the electrostatic puck 166 to the thermally conductive base 164 introduces warping in the electrostatic puck 166. Thus, a surface of the electrostatic puck 166 may have a flatness of about 20-30 microns. The flatness measurement refers to the difference between a highest point of the electrostatic puck's surface and a lowest point of the electrostatic puck's surface.

In contrast to traditional manufacturing techniques, in one embodiment described herein the surface of the electrostatic puck 166 is not prepared prior to bonding to the thermally conductive base 164. Instead, the electrostatic puck 166 is first bonded to the thermally conductive base 164. After the electrostatic puck 166 is bonded to the thermally conductive base 164, the electrostatic puck's surface is polished until it has a flatness of less than 10 microns (with a flatness of less than 5 microns in one particular embodiment). The electrostatic puck 166 is also polished to have an average roughness (Ra) of less than 0.15 microns (e.g., 0.05-0.15 microns (2-6 micro-inches) in one embodiment). The surface features are subsequently formed in the electrostatic puck 166. Accordingly, the surface features all have a flatness of less than 10 microns and an average roughness of less than 0.15 microns. This enables numerous refurbishment techniques to be later used on the electrostatic chuck 150 with a minimum of material removal. Accordingly, a number of times that the electrostatic chuck 150 can be refurbished is maximized and a life span of the electrostatic chuck 150 is increased.

Figure 3:
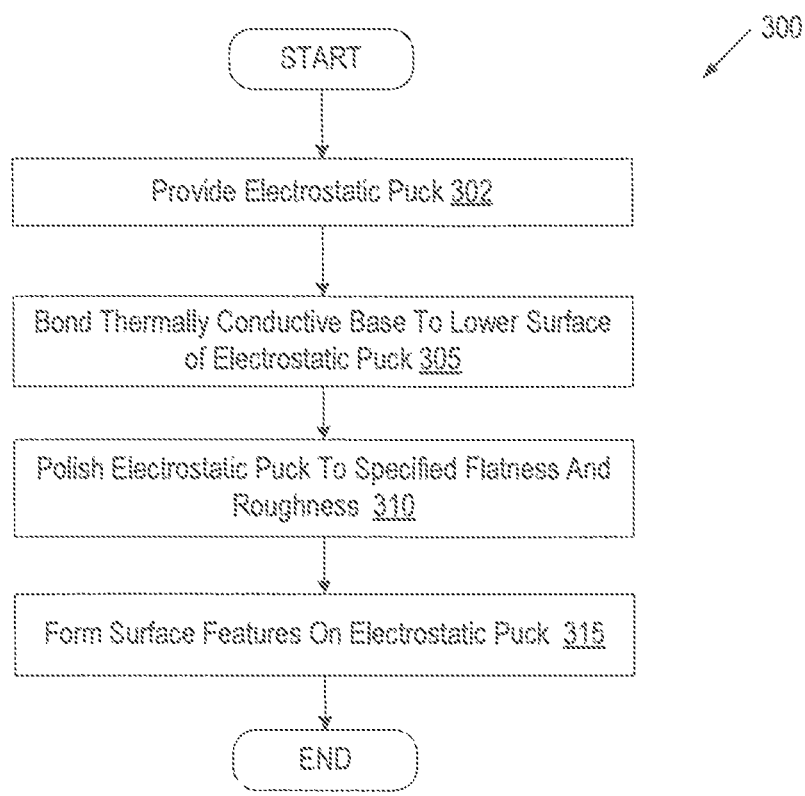
FIG. 3 illustrates one embodiment of a process for manufacturing an electrostatic chuck that is optimized for future refurbishment.

FIG. 3 illustrates one embodiment of a process 300 for manufacturing an electrostatic chuck that is optimized for future refurbishment. At block 302 of process 300, an electrostatic puck is provided. In one embodiment, the electrostatic puck is an aluminum nitride or alumina ceramic body. The electrostatic puck may contain heating elements, an electrode, cooling channels, and/or other interior elements. However, the electrostatic puck may have a bare surface.

At block 305, a lower surface of the electrostatic puck is bonded to a thermally conductive base. At block 310, a surface of the electrostatic puck (which is also now a surface of the electrostatic chuck) is polished to a specified flatness and roughness. In one embodiment, the surface is polished to a flatness of less than 10 microns and a roughness of less than 0.15 microns.

At block 315, surface features are formed on the polished surface of the electrostatic puck. In one embodiment, a mask is placed over the electrostatic puck. The mask masks portions of the electrostatic puck to be protected. The electrostatic puck is then processed. In one embodiment, the electrostatic chuck is bead blasted to remove and roughen exposed portions of the electrostatic puck (those portions not covered by the mask). The mask may then be removed and the electrostatic chuck cleaned (e.g., using de-ionized water). Resultant surface features may include a sealing band around a perimeter of the electrostatic puck and mesas throughout the electrostatic puck's surface (as shown in FIG. 2). In one embodiment, the surface features are polished down to a specified thickness (e.g., to about 12-16 microns in one particular embodiment).

Figure 4:
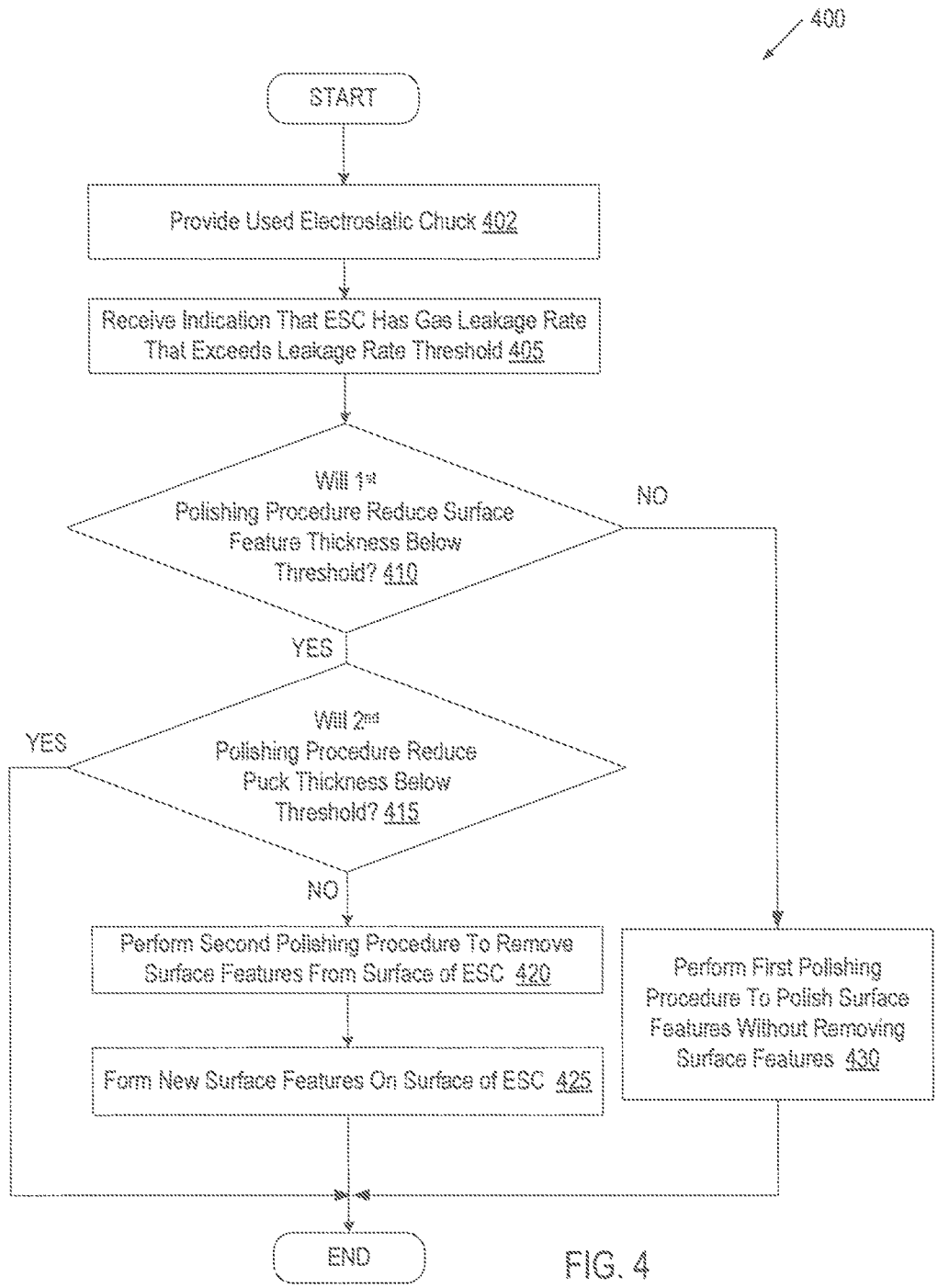
FIG. 4 illustrates one embodiment of a process for refurbishing an electrostatic chuck.

FIG. 4 illustrates one embodiment of a process 400 for refurbishing an electrostatic chuck. At block 402 of method 400, a used electrostatic chuck is provided. In one embodiment, the electrostatic chuck is an electrostatic chuck that has been manufactured in accordance with method 300. Alternatively, the electrostatic chuck may be a traditionally manufactured electrostatic chuck.

At block 405, an indication is received that the electrostatic chuck (ESC) has a gas leakage rate that exceeds a leakage rate threshold. For example, the acceptable gas leakage rate may be 1 or 2 standard cubic centimeters per minute (SCCM), and the measured gas leakage rate may be 3 SCCM. The gas leakage rate may have been measured during previous processing using the electrostatic chuck. This gas leakage rate may have been recorded and reported to an entity performing process 400. Alternatively, or additionally, the electrostatic chuck may be tested to determine a gas leakage rate.

The electrostatic chuck has numerous surface features, which may have a surface feature thickness. A specification for the electrostatic chuck may specify that the surface features may have a thickness within a specific range (e.g., 9-12 microns). A first polishing procedure (referred to herein as a soft polish) may remove a very small amount of material from the surface features, thus reducing the thickness of the surface features. For example, the soft polish may uniformly remove between 1 and 4 microns of material from the surface features. In one embodiment, the soft polish can be performed because the electrostatic chuck has a flatness that is below 10 microns. This extreme flatness simplifies the process of removing a uniform amount of material from all of the surface features of the electrostatic chuck. In another embodiment, a specified local area of the chuck may be selectively polished to remove desired material e.g., 1-4 microns polished and removed from the outside seal band of the ESC of width, for example, 1.5 mm.

At block 410, a determination is made as to whether the first polishing procedure (the soft polish) will reduce the surface feature thickness to below a thickness threshold. The thickness threshold may be based on the lower end of the surface feature thickness range provided by the electrostatic chuck's specification.

In one embodiment, it is determined that the first polishing procedure will cause the surface features to fall below the thickness threshold if the first polishing procedure has been performed on the electrostatic chuck a threshold number of times. For example, in one embodiment each instance of the first polishing procedure removes about 2 microns from the surface features, the surface features begin at 16 microns, and the thickness threshold is 8 microns. Accordingly, the first polishing procedure may be performed four times without reducing the surface features to below the thickness threshold. In another embodiment, the determination of whether the first polishing procedure will reduce the surface features to below the thickness threshold is performed as set forth in FIG. 4.

If the first polishing procedure will cause the surface features to fall below the thickness threshold, the process continues to block 415. Otherwise, the process proceeds to block 430.

At block 430, the first polishing procedure is performed. The first polishing procedure may remove about 1-4 microns of thickness from the surface features without removing the surface features. The first polishing procedure may be performed using, for example, chemical mechanical planarization (CMP) or a horizontal axis grinding wheel. In one embodiment, the electrostatic chuck is placed into a polishing apparatus in an inverted state, and the surface of the electrostatic chuck is rotated while being pressed against rotating pads. A slurry that includes an abrasive (e.g., a diamond abrasive or silicon carbide abrasive) and a carrier fluid may be introduced to the pads. The slurry may periodically be sprayed onto the pads for the polishing. In one embodiment, the slurry is sprayed onto the pads every minute for a duration of 15 seconds.

The first polishing procedure may be performed using about 0.5-1.0 micron grit abrasives. A loading (pressure) of approximately 5-20 pounds of force may be applied during the polishing. In one embodiment, the weight of the electrostatic chuck (e.g., about 10 pounds) is the primary or only loading used during the first polishing procedure. The first polishing procedure may last from about 1 to about 10 hours. In one embodiment, the first polishing procedure lasts about 2-4 hours. The polishing may cause the average surface roughness of the surface features to be reduced to about 2-6 micro-inches or 0.05-0.15 microns. The electrostatic chuck is then refurbished and ready for reuse after a post-polish cleaning procedure.

During polishing, removed waste material may clog holes such as helium holes that are formed in the electrostatic puck. Such waste material may be difficult to remove after the polishing is complete. Accordingly, to minimize or prevent such plugging of holes in the electrostatic puck, a fluid is directed through the holes from a back side of the electrostatic chuck to maintain positive pressure at hole openings at a top side of the electrostatic puck. Examples of fluids that may be flowed include de-ionized water, clean dry air and nitrogen. The fluid can have a flow rate of approximately 100 milliliters per minute in one embodiment. The fluid flow can be lower or higher depending on an aggressiveness of polishing.

In one embodiment, a back-plate fixture is attached to the back side of the electrostatic chuck. The back plate fixture may have holes that line up to holes in the back side of the electrostatic chuck. Alternatively, the back plate fixture may have a body that provides a sealed fluid connection to the holes in the back side of the electrostatic chuck. The back-plate fixture enables the fluid to be forced into inner and outer feed openings (e.g., backside ends of holes) on the backside of the electrostatic chuck.

FIG. 5 illustrates a back plate fixture 510 that attaches to a back side of an electrostatic chuck 505 during refurbishment. The back plate fixture 510 may be metal, plastic, ceramic, or another material. The back plate fixture 510 may seal against the back side of the electrostatic chuck 505. A center of the back plate fixture 510 at an axis of symmetry may have a rotatable coupling 515. Accordingly, the electrostatic chuck 505 and back plate fixture 510 may rotate during polishing while a hose 520 coupled to the back plate fixture 510 via the rotatable coupling 515 remains fixed in place. A fluid such as deionized (DI) water or compressed air may be distributed through the hose 520 into the back plate fixture 510. The hose 520 may be plastic, rubber, metal, or another material. The fluid may further be delivered through the back plate fixture 510 into the holes of the electrostatic chuck during polishing to prevent or minimize an amount of material that collects in the holes. The amount of fluid that is flowed through the electrostatic chuck's holes may be relatively small (e.g., 100 milliliters per minute in one embodiment). This may be a high enough flow to cause a positive pressure at a top side of the electrostatic chuck, but a low enough flow so as not to cause hydroplaning of a polishing pad or disk.

After polishing is performed, a high pressure flush may be performed using back plate fixture and the same fluid or a different fluid. For the high pressure flush, the amount of fluid that is flowed through the back plate fixture 510 and the electrostatic chuck 505 may be about 400-1000 milliliters per minute. This may cause any debris that managed to accumulate in the holes to be flushed out. The high pressure flush may be performed before a slurry used by and/or created during the polishing process dries. In one embodiment, the high pressure flush is performed less than 30 minutes after the polishing is completed.

The electrostatic chuck may include an electrode embedded in an electrostatic puck. The electrostatic puck may have a particular thickness above the electrode. The thickness may be based on a specification that specifies an acceptable thickness range above the electrode. For Johnson Rahbek electrostatic chucks, the thickness may be about 200-300 microns. For Columbic electrostatic chucks, the thickness may be about 200-500 microns. Alternatively, the specification may set forth an acceptable thickness of the electrostatic puck. Such thickness may also be about 200 microns in one embodiment.

In one embodiment, a male end of the rotatable coupling 515 connects to hose 520, while a female end of the rotatable coupling connects to the back plate fixture 510. Alternatively, the male end may connect to the back plate fixture 510. The male end may lack a parting line, which helps prevent leak paths, and may be used without a tube clamp in one embodiment. In one embodiment, the male end includes a soft over-turn stop that reduces damage caused from connection abuse and includes a replaceable O-ring. In one embodiment, the female end is a single piece.

Referring back to FIG. 4A, at block 415, a determination is made as to whether a second polishing procedure will cause the thickness above the electrode to fall below a second thickness threshold. Alternatively, a separation between the electrode and a bottom of the electrostatic puck may be known. Accordingly, an overall thickness of the electrostatic puck may be used rather than a thickness above the electrode. The overall thickness of the electrostatic puck may be easier to measure in some embodiments than the thickness above the electrode.

The second polishing procedure (referred to herein as a hard polish) removes the surface features from the surface of the electrostatic puck (and thus from the surface of the electrostatic chuck). The second polishing procedure may also remove additional material (e.g., 1-4 additional microns of material) from the surface of the electrostatic puck after the surface features are removed. Thus, the determination of whether the second polishing procedure will reduce the thickness of the electrostatic puck below the second thickness threshold may be made by subtracting the thickness of the surface features from the thickness of the electrostatic puck (or the thickness of the portion of the electrostatic puck above the electrode).

If the second polishing procedure will cause the thickness of the electrostatic puck to fall below the thickness threshold, then it is determined that the second polishing procedure should not be performed on the electrostatic chuck. Thus, it may be time to replace the electrostatic chuck. If the second polishing procedure will not cause the electrostatic puck to fall below the second thickness threshold, then the process continues to block 420.

At block 420, the second polishing procedure is performed. The second polishing procedure may be performed using the same or different equipment as the first polishing procedure. The second polishing procedure initially removes the surface features from the surface of the electrostatic puck. Thus, if the surface features are 8 microns thick, the second polishing procedure initially removes 8 microns of material. The second polishing procedure then removes additional material from the electrostatic puck's surface (e.g., between 1-5 additional microns of material in one embodiment). In one embodiment, the second polishing procedure removes about 10-30 microns of material from the surface of the electrostatic chuck.

Multiple different grits of abrasives such as diamond grit may be used for the second polishing procedure. A rough to medium grit abrasive (e.g., between about 3 and 100 micron grit) may be used initially for rapid material removal. A grit used for the polishing and an amount of pressure applied during the polishing (loading) affect thickness removal rate. For example, a 9 micron grit-embedded pad can remove about 10-20 microns/hour for a sintered alumina electrostatic puck. In one embodiment, an rough grit of about 30-50 microns is initially used. A subsequent grit of about 3-30 microns may then be used. For example, a sequence of multiple abrasives of descending grit size down to about 3 microns may be used in succession. The number of grit sizes and the specific grit sizes to use may be selected in accordance with the electrostatic puck's material properties and a desired removal rate.

After the medium to rough grit or grits of abrasives are used, one or more additional finer grits may be used in succession, where each successive grit is finer than a previous grit used. A final abrasive used to polish the electrostatic puck may be about a 0.5 to 1.0 micron grit diamond abrasive. The final grit may polish the surface of the electrostatic puck to a surface roughness of around 2-6 micro-inches. A loading of approximately 10 pounds of force to approximately 75 pounds of force may be applied during one or more early stages of the second polishing procedure. For later stages and/or a final stage of the second polishing procedure (in which very fine abrasives are used), the applied loading may be about 10 pounds. As with the first polishing procedure, fluid may be flowed through holes in the electrostatic chuck during the polishing to prevent clogging of the holes. After polishing, the electrostatic chuck may be cleaned, such as with a DI water or acetone bath.

At block 425, new surface features are formed on the electrostatic puck after the polishing is completed. The surface features may include mesas and a sealing band around a perimeter of the electrostatic puck. The features may be formed by masking portions of the electrostatic puck and then bead blasting the exposed portions. The electrostatic puck is then refurbished and ready for use.

Process 400 may be performed numerous times on an electrostatic chuck. For example, an electrostatic chuck may be refurbished twice using the first polishing procedure. The electrostatic chuck may then be refurbished using the second polishing procedure. Subsequently, the electrostatic chuck may again be refurbished multiple times using the first polishing procedure. This may continue over the life of the electrostatic chuck until a thickness of the electrostatic puck drops below a thickness threshold.

Corner rounding is a common consequence of polishing a hard surface using a soft or pliable surface. However, rounding of the surface features in an electrostatic puck may reduce the life of an electrostatic chuck. Accordingly, in one embodiment both the first polishing procedure and the second polishing procedure are performed without rounding edges of the polished electrostatic puck.

To perform the polishing without rounding corners of the surface features, a donut shaped polishing pad (e.g., a polishing pad with a center cutout is used. FIGS. 6A and 6B illustrate one embodiment of an electrostatic chuck 600 undergoing polishing. The electrostatic chuck 600 is inverted and pressed against a polishing pad 605 having a center cutout 610. The polishing pad 605 may rotate 615 in one direction, while the electrostatic chuck 600 may rotate 620 in an opposite direction.

FIG. 6A shows a cross sectional side view of the electrostatic chuck 600 and polishing pad 605, while FIG. 6B shows a top down view of the electrostatic chuck and polishing pad 605. As shown, electrostatic chuck 600 extends beyond the surface of the polishing pad 605 at the cutout 610. Additionally, the electrostatic chuck 605 extends to or beyond the outer perimeter of the polishing pad 605. This minimizes or eliminates rounding of edges in the electrostatic chuck 600 (e.g., rounding of edges of the surface features for the electrostatic puck).

Figure 7:
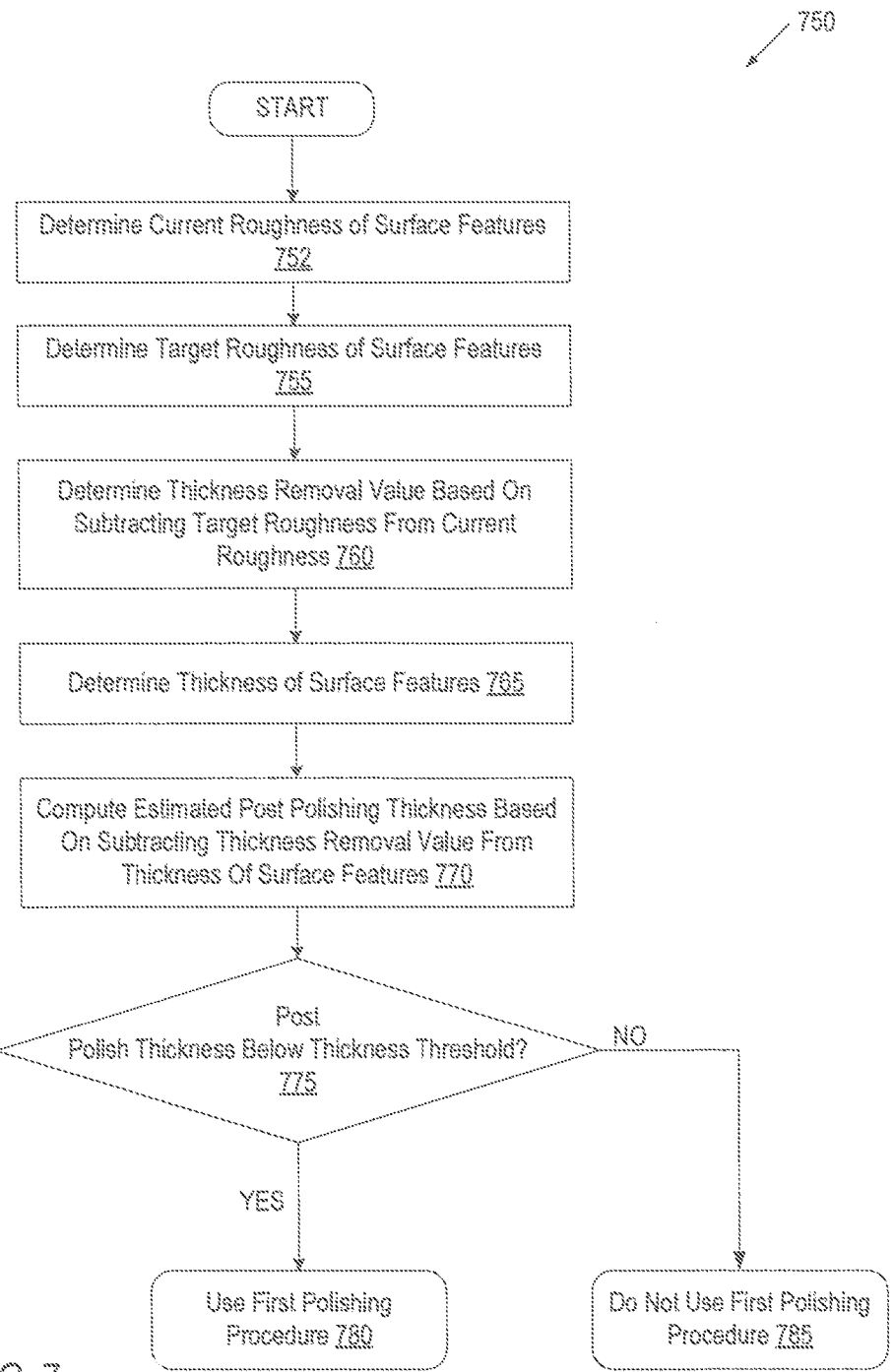
FIG. 7 illustrates one embodiment of a process for predicting a post polish thickness of surface features on an electrostatic chuck.

FIG. 7 illustrates one embodiment of a process 750 for predicting a post polish thickness of surface features on an electrostatic chuck. At block 752 of process 750, a roughness of the surface features is determined. The roughness may be determined by measuring the surface roughness. For example a profilometer may be used to measure the roughness. Alternatively, a relationship between a gas leakage rate and a surface roughness may be established and used to set up a model. The relationship may be developed by comparing gas leakage rates to surface roughness for a statistically significant sample set (e.g., for tens or hundreds of electrostatic chucks). The supplied or measured gas leakage rate may be inserted into the model to determine a surface roughness for the surface features.

At block 755, a target roughness of the surface features is determined. In one embodiment, the target is specified at 2-6 micro-inches. At block 760, a thickness removal value that represents that amount of thickness that will be removed is determined. The thickness removal value may be determined by subtracting the target roughness from the current roughness. At block 765, a thickness of the surface features is determined (e.g., by measuring). At block 770, an estimated post polishing thickness is computed based on subtracting the thickness removal value from the thickness of the surface features.

At block 775, it is determined whether the post polish thickness is below a thickness threshold. If the estimated post polish thickness is below the thickness threshold, then the process proceeds to block 780 and a first polishing procedure may be performed. Otherwise, the process continues to block 785, and the first polishing process may not be performed.

Figure 8A:
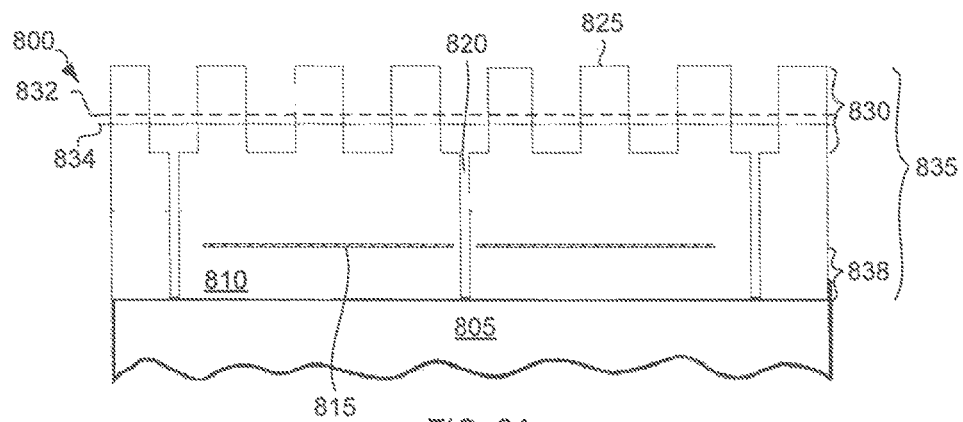
FIG. 8A illustrates one embodiment of an electrostatic chuck before refurbishment.

FIG. 8A illustrates a cross sectional side view of one embodiment of an electrostatic chuck 800 prior to performance of a first polishing procedure (soft polish) or a second polishing procedure (hard polish). The electrostatic chuck 800 has an electrostatic puck 810. The electrostatic puck 810 includes an electrode 815, an upper portion above the electrode 815 and a lower portion 840 below the electrode 815. The upper portion may have a thickness of greater than approximately 200 microns (e.g., 5 mil in one embodiment). The electrostatic puck 800 has a thickness 835, which may be between about 200 microns and 500 microns in one embodiment. A lower surface of the electrostatic puck 500 is bonded to a thermally conductive base 805 (e.g., a metal base) via a bond such as a silicone bond. The electrostatic chuck 800 can be used both for Johnson-Rahbek electrostatic chucking applications and Columbic electrostatic chucking applications.

The electrostatic puck 810 includes holes 820 through which a heat conductive gas such as helium may be flowed. The holes 820 are commonly referred to as helium holes. Surface features 825 may be formed on an upper surface of the electrostatic puck 800. The surface features 825 may have a thickness 830, and may include mesas and a sealing band. As the electrostatic chuck 800 is used, a roughness of the surface features 825 may gradually increase until the surface roughness causes a gas leakage rate of the electrostatic chuck to raise above a gas leakage threshold. Additionally, the roughness for the surface feature 825 may increase until they exceed a roughness threshold. There may be a correlation (e.g., a direct correlation) between the surface roughness and the gas leakage rate. Accordingly, one or both of the surface roughness threshold and the leakage rate threshold may be used to determine when an electrostatic chuck should be refurbished. At this point, the roughness of the surface features 825 may be, for example, around 4-8 microns.

Once electrostatic chuck 800 has a gas leakage rate that exceeds the gas leakage threshold, process 400 may be performed to refurbish the electrostatic chuck. In accordance with process 400, a post polishing surface feature thickness 832 may be estimated. The post polishing surface feature thickness may be compared to a thickness threshold 834. For electrostatic chuck 850, the estimated post polishing thickness 832 is above the thickness threshold. Accordingly, the first polishing procedure may be performed to polish the surface features 825.

Figure 8B:
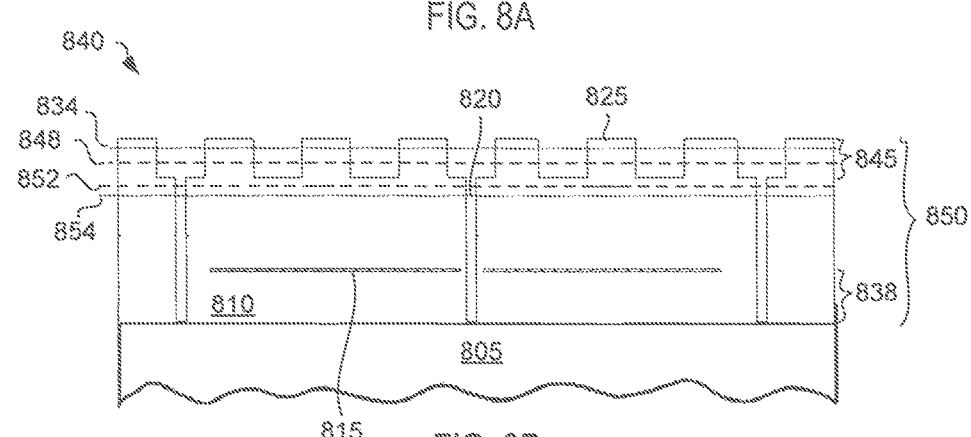
FIG. 8B illustrates one embodiment of an electrostatic chuck after a first polishing procedure is performed.

FIG. 8B illustrates a cross sectional side view of one embodiment of a refurbished electrostatic chuck 840, which corresponds to electrostatic chuck 800 after performing a first polishing procedure (soft polish). The first polishing procedure reduced a thickness 845 of the surface features 825 and additionally reduced a surface roughness of the surface features. The thickness of the surface features may be reduced, for example, by about 2 microns in one embodiment. The overall thickness 850 of the electrostatic puck 810 (and accordingly of the portion of the electrostatic puck above the electrode 815) are also reduced a corresponding amount (e.g., 2 microns). In one embodiment, the roughness of the surface features 825 is reduced to about 2-6 microinches.

As the refurbished electrostatic chuck 840 is used in processing, the roughness of the surface features 825 again gradually increases. This eventually causes the gas leakage rate to again exceed the gas leakage threshold. Once electrostatic chuck 840 has a gas leakage rate that exceeds the gas leakage threshold, process 400 may be performed to again refurbish the electrostatic chuck. In accordance with process 400, a post polishing surface feature thickness 848 may be estimated. The post polishing surface feature thickness 848 may be compared to the thickness threshold 834. For electrostatic chuck 840, the estimated post polishing thickness 848 is below the thickness threshold 834. Accordingly, the first polishing procedure may not be performed to polish the surface features 825.

Since the first polishing procedure will not be performed, it is determined whether the second polishing procedure (hard polish) may be performed. Accordingly, an additional post polishing thickness 852 is estimated for the electrostatic puck 810. The additional post polishing thickness 852 represents the estimated thickness of the electrostatic puck 810 after the second polishing procedure is completed. The estimated post polishing thickness 852 is compared to a thickness threshold 854 for the electrostatic puck 810. As shown, the estimated thickness 852 is above the thickness threshold 854. Accordingly, the second polishing procedure may be performed on electrostatic chuck 840 to again refurbish the electrostatic chuck 840.

Figure 8C:
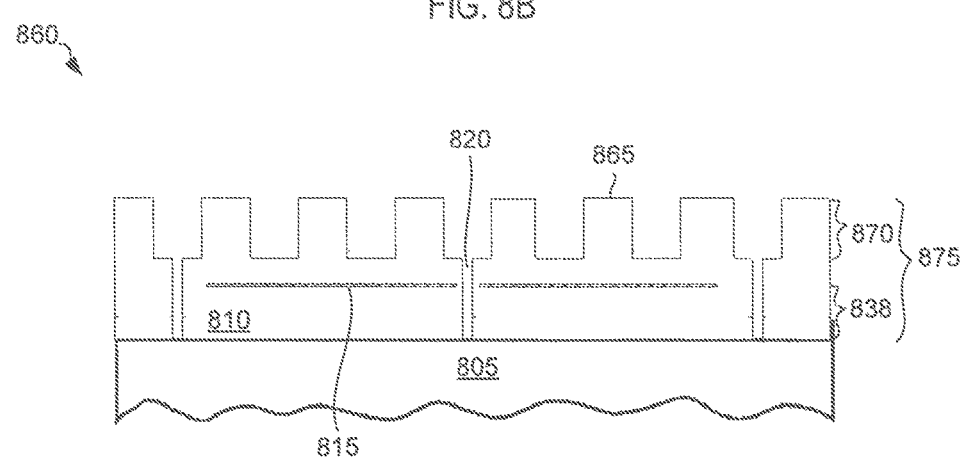
FIG. 8C illustrates one embodiment of an electrostatic chuck after a second polishing procedure is performed.

FIG. 8C illustrates a cross sectional side view of one embodiment of a refurbished electrostatic chuck 860, which corresponds to electrostatic chuck 840 after performing a second polishing procedure (hard polish). The second polishing procedure reduced a thickness 875 of the electrostatic puck 810 and additionally reduced a surface roughness of the surface of the electrostatic puck 810. Additionally, after the second polishing procedure was performed, new surface features 865 were formed in the electrostatic puck 810. The new surface features 865 have a thickness 870 that meets or exceeds a surface feature thickness threshold The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±25%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of manufacturing an electrostatic chuck, comprising:
   bonding an electrostatic puck to a metal base plate, wherein the electrostatic puck has an electrode embedded in the electrostatic puck;
   subsequently polishing, using a polishing pad that comprises a center cutout, a surface of the electrostatic puck to a flatness of below 10 microns and an average surface roughness of approximately 2-6 micro-inches; and
   subsequently forming surface features on the surface of the electrostatic puck, the surface features comprising mesas and a sealing band around a perimeter of the electrostatic puck.

2. The method of claim 1, wherein the electrostatic puck is bonded to the metal base plate without first polishing the electrostatic puck.

3. The method of claim 1, wherein the surface features have a thickness of 12-16 microns.

4. The method of claim 1, wherein the electrostatic puck has a thickness of 200-300 microns.

5. The method of claim 1, wherein a grit of about 0.5-1.0 microns is used to polish the surface of the electrostatic puck.

6. The method of claim 1, further comprising:
   periodically spraying, during the polishing, a slurry comprising an abrasive and a carrier fluid onto the polishing pad.

7. The method of claim 1, wherein the polishing is performed without rounding edges of the electrostatic puck.

8. The method of claim 1, further comprising:
   performing an additional polishing procedure to polish the surface features after forming the surface features.

9. The method of claim 1, wherein the surface of the electrostatic puck is polished to a flatness of below 5 microns.

10. The method of claim 1, wherein the bonding of the electrostatic puck to the metal base plate is performed while the electrostatic puck has a bare surface that lacks the surface features.

11. The method of claim 1, further comprising:
    placing a mask over first regions of the surface of the electrostatic puck, wherein second regions of the surface are exposed;
    bead blasting the second regions of the surface of the electrostatic puck that are exposed by the mask;
    removing the mask from the electrostatic puck; and
    cleaning the electrostatic puck using deionized water.

12. The method of claim 1, further comprising:
    drilling a first plurality of holes in the electrostatic puck; and
    flowing a fluid through the first plurality of holes in the electrostatic puck during the polishing to maintain positive pressure at openings of the first plurality of holes at the surface of the electrostatic puck to prevent the first plurality of holes from becoming clogged, wherein metal base plate has a second plurality of holes that line up to the first plurality of holes in the electrostatic puck.

13. The method of claim 12, wherein a flow rate for the fluid is approximately 50-150 milliliters per minute.

14. The method of claim 1, wherein bonding the electrostatic puck to the metal base comprises:
    disposing a thermally conductive paste or a thermally conductive tape on at least one of the electrostatic puck or the metal base plate, wherein the thermally conductive paste and the thermally conductive tape each comprise at least one of an acrylic based compound or a silicone based compound.

15. The method of claim 14, wherein the acrylic based compound and the silicone based compound each comprises at least one of a metal filler or a ceramic filler.

16. The method of claim 15, wherein:
    the metal filler is selected from the group consisting of Al, Mg, Ta and Ti; and
    the ceramic filler is selected from the group consisting of $Al_2O_3$, AN and $TiB_2$.

17. A method of manufacturing an electrostatic chuck, comprising:
    bonding an electrostatic puck to a metal base plate, wherein the electrostatic puck has an electrode embedded in the electrostatic puck;
    subsequently polishing a surface of the electrostatic puck to a flatness of below 10 microns and an average surface roughness of approximately 2-6 micro-inches;
    flowing a fluid through a first plurality of holes in the electrostatic puck during the polishing to maintain positive pressure at openings of the first plurality of holes at the surface of the electrostatic puck to prevent the first plurality of holes from becoming clogged, wherein the first plurality of holes are drilled in the electrostatic puck, wherein metal base plate has a second plurality of holes that are aligned with the first plurality of holes in the electrostatic puck; and
    subsequently forming surface features on the surface of the electrostatic puck, the surface features comprising mesas and a sealing band around a perimeter of the electrostatic puck.

18. The method of claim 17, wherein a flow rate for the fluid is approximately 50-150 milliliters per minute.

19. A method of manufacturing an electrostatic chuck, comprising:
    bonding an electrostatic puck to a metal base plate, wherein the electrostatic puck has an electrode embedded in the electrostatic puck;
    subsequently polishing a surface of the electrostatic puck to a flatness of below 10 microns and an average surface roughness of approximately 2-6 micro-inches; and
    subsequently forming surface features on the surface of the electrostatic puck, the surface features comprising mesas and a sealing band around a perimeter of the electrostatic puck, wherein the forming of the surface features comprises:
        placing a mask over first regions of the surface of the electrostatic puck, wherein second regions of the surface are exposed;
        bead blasting the second regions of the surface of the electrostatic puck that are exposed by the mask;
        removing the mask from the electrostatic puck; and
        cleaning the electrostatic puck using deionized water.

20. The method of claim 19 further comprising polishing the surface features to a thickness of approximately 12-16 microns.

* * * * *